(12) United States Patent
Lu et al.

(10) Patent No.: US 8,339,211 B2
(45) Date of Patent: Dec. 25, 2012

(54) VOLTAGE-CONTROLLED OSCILLATOR

(75) Inventors: Shey-Shi Lu, Taipei (TW); Hsien-Ku Chen, New Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 13/067,903

(22) Filed: Jul. 6, 2011

(65) Prior Publication Data
US 2012/0223779 A1    Sep. 6, 2012

(30) Foreign Application Priority Data
Mar. 1, 2011   (TW) .................................. 100106695

(51) Int. Cl.
*H03B 5/08* (2006.01)

(52) U.S. Cl. ... 331/167; 331/2; 331/107 SL; 331/177 V; 331/117 R; 331/117 FE

(58) Field of Classification Search .................... 331/57, 331/107 SL, 117 R, 117 FE, 167, 2, 177 V
See application file for complete search history.

(56) References Cited

U.S. PATENT DOCUMENTS

| 7,199,675 B2 * | 4/2007 | Lee et al. | 331/117 FE |
| 7,724,102 B2 * | 5/2010 | Ullmann | 331/117 R |

* cited by examiner

*Primary Examiner* — Arnold Kinkead
(74) *Attorney, Agent, or Firm* — Bacon & Thomas, PLLC

(57) ABSTRACT

This invention provides a voltage-controlled oscillator, comprising a first voltage-controlled oscillator circuit and a second voltage-controlled oscillator circuit. The first voltage-controlled oscillator circuit comprises a plurality of inductors, a plurality of variable capacitors, and a plurality of MOS transistors. The circuit configuration of the second voltage-controlled oscillator circuit is symmetrical to that of the first voltage-controlled oscillator circuit. The inductors of the first voltage-controlled oscillator circuit are cross-coupled to the inductors of the second voltage-controlled oscillator circuit.

9 Claims, 2 Drawing Sheets

VOLTAGE-CONTROLLED OSCILLATOR

BACKGROUND OF THE INVENTION

1. Field of the Invention

The present invention relates to a voltage-controlled oscillator, and more particularly, to a quadrature-phase voltage-controlled oscillator(VCO) used in the receivers and transmitters of wideband wired/wireless transmission systems/networks, products for ultra-wideband communication systems, or wireless network adapters.

2. Description of the Prior Art

In recent years, as the wireless communication technology has rapidly developed and the semiconductor technology has been improved, wireless communication products are facing higher standards. As such, RF circuits are required to operate at higher frequencies and larger amplitudes, with low voltages and low power consumptions. FIG. 1 shows a conventional quadrature-phase VCO using series coupling transistors. The structure of such a quadrature-phase VCO has the following disadvantages:

1. The VCO cannot operate at a low voltage.
2. The flicker noise from the coupling transistors may be up-converted to a frequency near the operation frequency.
3. The coupling transistors require larger sizes, which limits the operation frequency.
4. The VCO is of the source degeneration type, and the transconductance may decrease at high frequencies; thus, high frequency operation is rather limited.

On the other hand, there are some different quadrature-phase VCOs using coupling coils to overcome the aforementioned disadvantages; however, no conventional quadrature-phase VCO using coupling coils can overcome both the disadvantage that the flicker noise from the coupling transistors may be up-converted to a frequency near the operation frequency and the disadvantage of source degeneration at a high frequency.

In view of the above, the present invention provides a voltage-controlled oscillator operating at higher operation frequencies and larger amplitudes but with low voltages and low power consumptions. The present invention is thus industrially applicable.

SUMMARY OF THE INVENTION

An object of the present invention is to provide a voltage-controlled oscillator operating at higher operation frequencies and larger amplitudes but with low voltages and low power consumptions.

To achieve the aforementioned object, the present invention provides a voltage-controlled oscillator comprising a first voltage-controlled oscillator circuit and a second voltage-controlled oscillator circuit. The first voltage-controlled oscillator circuit comprises: a first inductor having a first end and a second end, the first end of the first inductor being coupled to a voltage source; a second inductor having a first end and a second end, the first end of the second inductor being coupled to the voltage source; a first variable capacitor having a first end and a second end, the first end of the first variable capacitor being coupled to a first control voltage, and the second end of the first variable capacitor being coupled to the second end of the first inductor; a second variable capacitor having a first end and a second end, the first end of the second variable capacitor being coupled to the first control voltage, and the second end of the second variable capacitor being coupled to the second end of the second inductor; a third inductor having a first end and a second end, the first end of the third inductor being coupled to the second end of the first inductor; a fourth inductor having a first end and a second end, the first end of the fourth inductor being coupled to the second end of the second inductor; a first NMOS transistor having a drain terminal coupled to the second end of the third inductor, a gate terminal coupled to the second end of the second inductor, and a source terminal being grounded; and a second NMOS transistor having a drain terminal coupled to the second end of the fourth inductor, a gate terminal coupled to the second end of the first inductor, and a source terminal being grounded. The second voltage-controlled oscillator circuit comprises: a fifth inductor having a first end and a second end, the first end of the fifth inductor being coupled to the voltage source; a sixth inductor having a first end and a second end, the first end of the sixth inductor being coupled to the voltage source; a third variable capacitor having a first end and a second end, the first end of the third variable capacitor being coupled to a second control voltage, and the second end of the third variable capacitor being coupled to the second end of the fifth inductor; a fourth variable capacitor having a first end and a second end, the first end of the fourth variable capacitor being coupled to the second control voltage, and the second end of the fourth variable capacitor being coupled to the second end of the sixth inductor; a seventh inductor having a first end and a second end, the first end of the seventh inductor being coupled to the second end of the fifth inductor; an eighth inductor having a first end and a second end, the first end of the eighth inductor being coupled to the second end of the sixth inductor; a third NMOS transistor, having a drain terminal coupled to the second end of the seventh inductor, a gate terminal coupled to the second end of the sixth inductor, and a source terminal being grounded; and a fourth MOS transistor, having a drain terminal coupled to the second end of the eighth inductor, a gate terminal coupled to the second end of the fifth inductor, and a source terminal being grounded.

In the aforementioned voltage-controlled oscillator of the present invention, the first inductor of the first voltage-controlled oscillator circuit is cross-coupled to the seventh inductor of the second voltage-controlled oscillator circuit, the second inductor of the first voltage-controlled oscillator circuit is cross-coupled to the eighth inductor of the second voltage-controlled oscillator circuit, the fifth inductor of the second voltage-controlled oscillator circuit is cross-coupled to the fourth inductor of the first voltage-controlled oscillator circuit, and the sixth inductor of the second voltage-controlled oscillator circuit is cross-coupled to the third inductor of the first voltage-controlled oscillator circuit.

By specific ways of connection of the aforementioned elements (i.e., inductors, capacitors, and transistors) and cross-couplings of the aforementioned inductors, the voltage-controlled oscillator of the present invention obtains the advantages that it can operate at higher operation frequencies and larger amplitudes but with low voltage and low power consumption.

DETAILED DESCRIPTION OF THE PREFERRED EMBODIMENTS

The present invention discloses a voltage-controlled oscillator with a new configuration and now will be described more fully hereinafter with reference to the accompanying drawings, in which preferred embodiments of the invention are shown.

Figure 1:
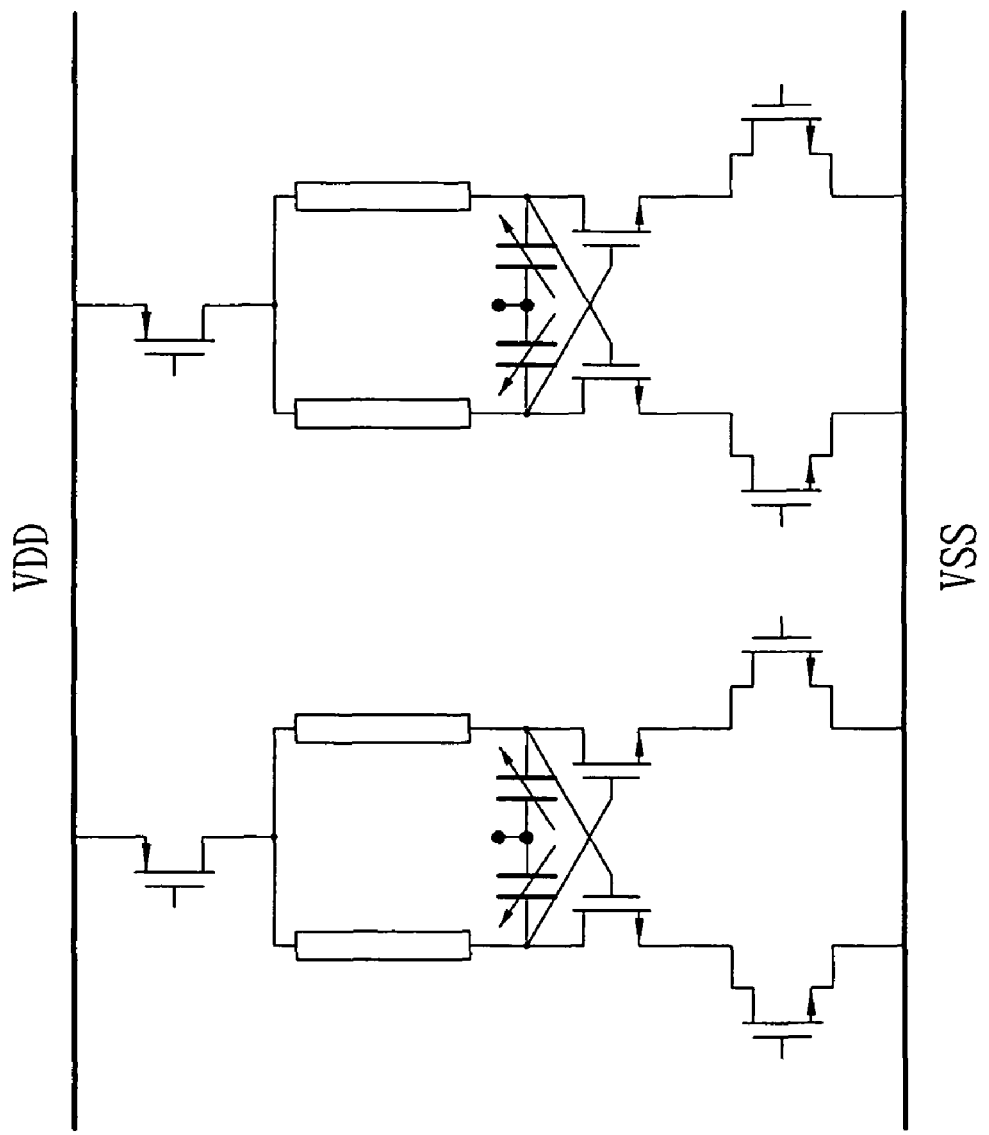
FIG. 1 shows a conventional quadrature-phase VCO using series coupling transistors.
Figure 2:
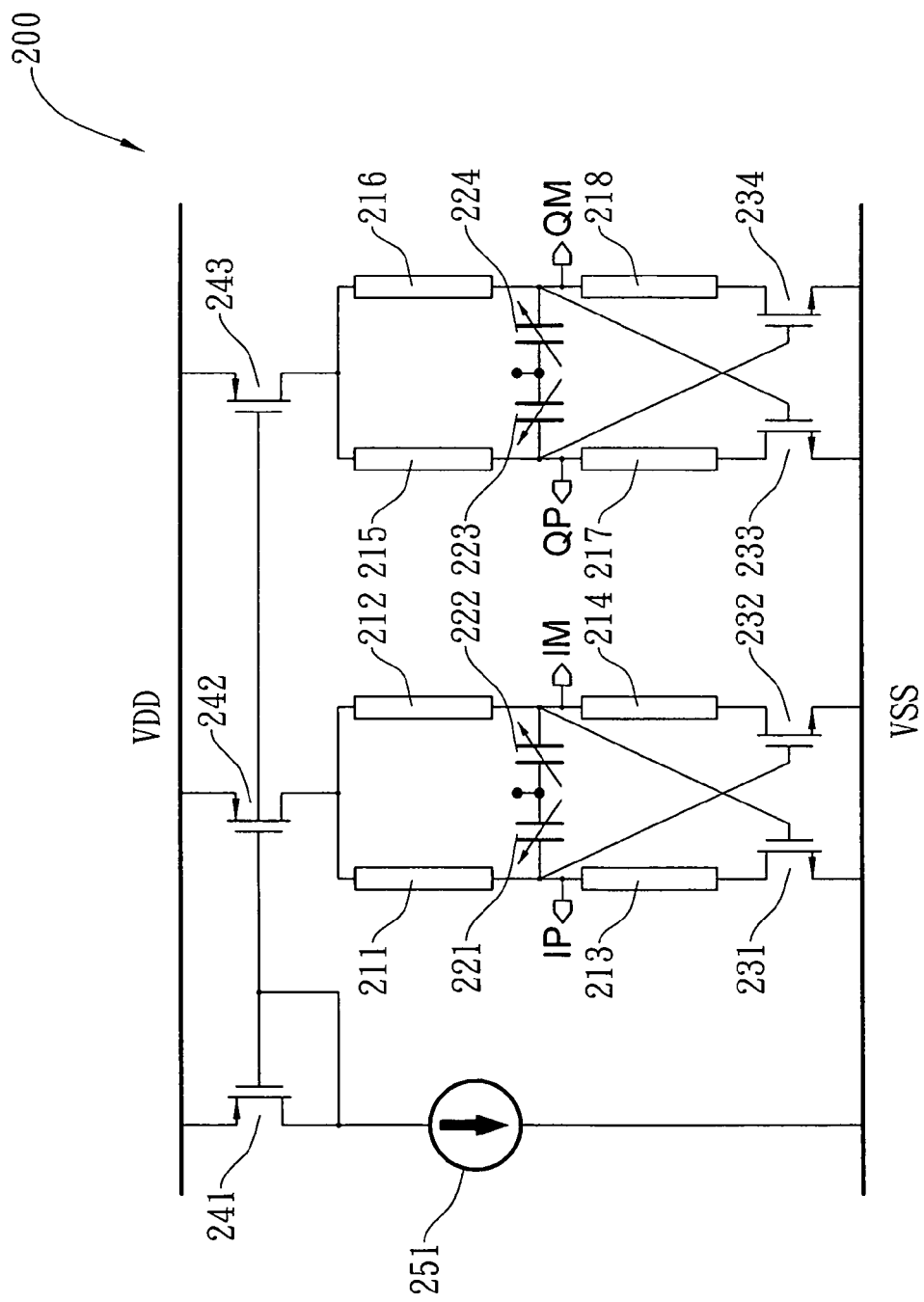
FIG. 2 is a schematic view showing a voltage-controlled oscillator according to an embodiment of the present invention.

Referring to FIG. 2, FIG. 2 is a schematic view showing a voltage-controlled oscillator according to an embodiment of the present invention. A voltage-controlled oscillator 200 of the present invention comprises a first voltage-controlled oscillator circuit having a first output IP and a second output IM, and a second voltage-controlled oscillator circuit having a third output QP and a fourth output QM. The first voltage-controlled oscillator circuit and the second voltage-controlled oscillator circuit are coupled to a voltage source in parallel. The circuit configuration of the second voltage-controlled oscillator circuit is identical to that of the first voltage-controlled oscillator circuit, and the third output QP and the fourth output QM are arranged at the nodes corresponding to the nodes of the first output IP and the second output IM. In the embodiment of the present invention, the first voltage-controlled oscillator circuit comprises a first inductor 211, a second inductor 212, a third inductor 213, a fourth inductor 214, a first variable capacitor 221, a second variable capacitor 222, a first NMOS transistor 231, and a second NMOS transistor 232. The second voltage-controlled oscillator circuit comprises a fifth inductor 215, a sixth inductor 216, a seventh inductor 217, an eighth inductor 218, a third variable capacitor 223, a fourth variable capacitor 224, a third NMOS transistor 233, and a fourth NMOS transistor 234. The voltage-controlled oscillator 200 further comprises PMOS transistors 241, 242, 243 and a current source 251 to provide the current needed for the voltage-controlled oscillator 200 and limit its current consumption.

Referring to the first voltage-controlled oscillator on the left side of FIG. 2, connections among the elements (i.e., inductors, capacitors, and transistors) of the first voltage-controlled oscillator will be described more fully hereinafter. The first inductor 211 has a first end and a second end. The first end of the first inductor 211 is coupled to a voltage source VDD, and the second end of the first inductor 211 is the first output IP. The second inductor 212 has a first end and a second end. The first end of the second inductor 212 is coupled to the voltage source VDD, and the second end of the second inductor 212 is the second output IM. The first variable capacitor 221 has a first end and a second end. The first end of the first variable capacitor 221 is coupled to a first control voltage $V_{TUNE}$, and the second end of the first variable capacitor 221 is coupled to the second end of the first inductor 211. The second variable capacitor 222 has a first end and a second end. The first end of the second variable capacitor 222 is coupled to the first control voltage $V_{TUNE}$, and the second end of the second variable capacitor 222 is coupled to the second end of the second inductor 212. The third inductor 213 has a first end and a second end. The first end of the third inductor 213 is coupled to the second end of the first inductor 211. The fourth inductor 214 has a first end and a second end. The first end of the fourth inductor 214 is coupled to the second end of the second inductor 212. The drain terminal of the first NMOS transistor 231 is coupled to the second end of the third inductor 213. The gate terminal of the first NMOS transistor 231 is coupled to the second end of the second inductor 212. The source terminal of the first NMOS transistor 231 is grounded or coupled to the negative terminal of the voltage source VSS. The drain terminal of the second NMOS transistor 232 is coupled to the second end of the fourth inductor 214. The gate terminal of the second NMOS transistor 232 is coupled to the second end of the first inductor 211. The source terminal of the second NMOS transistor 232 is grounded or coupled to the negative terminal of the voltage source VSS. In one embodiment of the present invention, the inductors 211, 212, 213, and 214 may be coils, transmission lines, waveguides, or other elements that can function as inductors; the capacitors 221 and 222 may be diodes or other elements that can function as variable capacitors. In addition, the first inductor 211 and the second inductor 212 may form the primary side of a first transformer, and the third inductor 213 and the fourth inductor 214 may form the secondary side of the first transformer.

Referring to the second voltage-controlled oscillator on the right side of FIG. 2, connections among the elements (i.e., inductors, capacitors, and transistors) of the second voltage-controlled oscillator will be described more fully hereinafter: The fifth inductor 215 has a first end and a second end. The first end of the fifth inductor 215 is coupled to a voltage source VDD, and the second end of the fifth inductor 215 is the third output QP. The sixth inductor 216 has a first end and a second end. The first end of the sixth inductor 216 is coupled to the voltage source VDD, and the second end of the sixth inductor 216 is the fourth output QM. The third variable capacitor 223 has a first end and a second end. The first end of the third variable capacitor 223 is coupled to a second control voltage $V_{TUNE}$, and the second end of the third variable capacitor 223 is coupled to the second end of the fifth inductor 215. The fourth variable capacitor 224 has a first end and a second end. The first end of the fourth variable capacitor 224 is coupled to the second control voltage $V_{TUNE}$, and the second end of the fourth variable capacitor 224 is coupled to the second end of the sixth inductor 216. The seventh inductor 217 has a first end and a second end. The first end of the seventh inductor 217 is coupled to the second end of the fifth inductor 215. The eighth inductor 218 has a first end and a second end. The first end of the eighth inductor 218 is coupled to the second end of the sixth inductor 216. The drain terminal of the third NMOS transistor 233 is coupled to the second end of the seventh inductor 217. The gate terminal of the third NMOS transistor 233 is coupled to the second end of the sixth inductor 216. The source terminal of the third NMOS transistor 233 is grounded or coupled to the negative terminal of the voltage source VSS. The drain terminal of the fourth NMOS transistor 234 is coupled to the second end of the eighth inductor 218. The gate terminal of the fourth NMOS transistor 234 is coupled to the second end of the fifth inductor 215. The source terminal of the fourth NMOS transistor 234 is grounded or coupled to the negative terminal of the voltage source VSS. In one embodiment of the present invention, the inductors 215, 216, 217, and 218 may be coils, transmission lines, waveguides, or other elements that can function, as inductors; the capacitors 223 and 2,24 may be diodes or other elements that can function as variable capacitors. In addition, the fifth inductor 215 and the sixth inductor 216 may form the primary side of a second transformer, and the seventh inductor 217 and the eighth inductor 218 may form the secondary side of the second transformer.

As shown in FIG. 5, the first inductor 211 of the first voltage-controlled oscillator circuit is cross-coupled to the seventh inductor 217 of the second voltage-controlled oscillator circuit; the second inductor 212 of the first voltage-controlled oscillator circuit is cross-coupled to the eighth inductor 218 of the second voltage-controlled oscillator circuit; the fifth inductor 215 of the second voltage-controlled oscillator circuit is cross-coupled to the fourth inductor 214 of the first voltage-controlled oscillator circuit; and the sixth inductor 216 of the second voltage-controlled oscillator circuit is cross-coupled to the third inductor 213 of the first voltage-controlled oscillator circuit. Through this configuration, the present invention allows the first voltage-controlled oscillator. circuit and the second voltage-controlled oscillator circuit to be cross-connected to each other so as to generate quadrature-phase oscillating signals at the nodes of the first output IP, the second output IM, the third output QP, and the fourth output QM. Moreover, there is no coupling transistor used in the present invention, and hence, the disadvantage that the flicker noise from the coupling transistors may be up-converted to a frequency near the operation frequency does not exist. The source terminals of the NMOS transistors 231, 232, 233, and 234 are grounded or coupled to the negative terminal of the voltage source VSS, and hence, the disadvantage of source degeneration at a high frequency does not exist. Accordingly, by specific ways of connection of the aforementioned elements (i.e., inductors, capacitors, and transistors) and cross-couplings of the aforementioned inductors, the voltage-controlled oscillator of the present invention obtains the advantages that it can operate at higher operation frequencies and larger amplitudes but with low voltage and low power consumption.

While this invention has been described by way of examples and in terms of preferred embodiments, it is to be understood that this invention is not limited hereto. For example, it will be apparent to those skilled in the art that the aforementioned NMOS transistors may be replaced by the PMOS transistors. Similarly, it will be apparent to those skilled in the art that the aforementioned PMOS transistors may be replaced by the NMOS transistors. It is to be understood that various changes and modifications can be made by those skilled in the art without departing from the spirit and scope of this invention. It is intended that the scope of the invention be defined by the claims appended hereto.

What is claimed is:

1. A voltage-controlled oscillator, comprising: a first voltage-controlled oscillator circuit having a first output and a second output; and a second voltage-controlled oscillator circuit having a third output and a fourth output, the first voltage-controlled oscillator circuit and the second voltage-controlled oscillator circuit being coupled to a voltage source in parallel, and the first, second, third, fourth outputs generating quadrature-phase oscillating signals;
   wherein the first voltage-controlled oscillator circuit comprises:
      a first inductor having a first end and a second end, the first end of the first inductor being coupled to the voltage source, and the second end of the first inductor being the first output;
      a second inductor having a first end and a second end, the first end of the second inductor being coupled to the voltage source, and the second end of the second inductor being the second output;
      a first variable capacitor having a first end and a second end, the first end of the first variable capacitor being coupled to a first control voltage, and the second end of the first variable capacitor being coupled to the second end of the first inductor;
      a second variable capacitor having a first end and a second end, the first end of the second variable capacitor being coupled to the first control voltage, and the second end of the second variable capacitor being coupled to the second end of the second inductor;
      a third inductor having a first end and a second end, the first end of the third inductor being coupled to the second end of the first inductor;
      a fourth inductor having a first end and a second end, the first end of the fourth inductor being coupled to the second end of the second inductor;
      a first MOS transistor having a first end coupled to the second end of the third inductor, a gate terminal coupled to the second end of the second inductor, and a second end being grounded; and
      a second MOS transistor having a first end coupled to the second end of the fourth inductor, a gate terminal coupled to the second end of the first inductor, and a second end being grounded;
   wherein a circuit configuration of the second voltage-controlled oscillator circuit is identical to that of the first voltage-controlled oscillator circuit, and the third output and the fourth output are arranged at nodes corresponding to the nodes of the first output and the second output.

2. The voltage-controlled oscillator according to claim 1, wherein the second voltage-controlled oscillator circuit comprises:
   a fifth inductor having a first end and a second end, the first end of the fifth inductor being coupled to the voltage source, and the second end of the fifth inductor being the third output of the second voltage-controlled oscillator circuit;
   a sixth inductor having a first end and a second end, the first end of the sixth inductor being coupled to the voltage source, and the second end of the sixth inductor being the fourth output of the second voltage-controlled oscillator circuit;
   a third variable capacitor having a first end and a second end, the first end of the third variable capacitor being coupled to a second control voltage, and the second end of the third variable capacitor being coupled to the second end of the fifth inductor;
   a fourth variable capacitor having a first end and a second end, the first end of the fourth variable capacitor being coupled to the second control voltage, and the second end of the fourth variable capacitor being coupled to the second end of the sixth inductor;
   a seventh inductor having a first end and a second end, the first end of the seventh inductor being coupled to the second end of the fifth inductor;
   an eighth inductor having a first end and a second end, the first end of the eighth inductor being coupled to the second end of the sixth inductor;
   a third MOS transistor having a first end being coupled to the second end of the seventh inductor, a gate terminal being coupled to the second end of the sixth inductor, and a second end being grounded; and
   a fourth MOS transistor having a first end being coupled to the second end, a gate terminal being coupled to the second end of the fifth inductor, and a second end being grounded.

3. The voltage-controlled oscillator according to claim 2, wherein the first inductor of the first voltage-controlled oscillator circuit is cross-coupled to the seventh inductor of the second voltage-controlled oscillator circuit, the second inductor of the first voltage-controlled oscillator circuit is cross-coupled to the eighth inductor of the second voltage-controlled oscillator circuit, the fifth inductor of the second voltage-controlled oscillator circuit is cross-coupled to the fourth inductor of the first voltage-controlled oscillator circuit, and the sixth inductor of the second voltage-controlled oscillator circuit is cross-coupled to the third inductor of the first voltage-controlled oscillator circuit.

4. The voltage-controlled oscillator according to claim 1, wherein the inductors are coils, transmission lines or waveguides.

5. The voltage-controlled oscillator according to claim 1, wherein the variable capacitors are diodes.

6. The voltage-controlled oscillator according to claim 1, wherein the first inductor and the second inductor of the first voltage-controlled oscillator circuit form the primary side of a first transformer, and the third inductor and the fourth inductor of the first voltage-controlled oscillator circuit form the secondary side of the first transformer.

7. The voltage-controlled oscillator according to claim 2, wherein the MOS transistors are NMOS transistors, the first ends of the NMOS transistors are drain terminals, and the second ends of the NMOS transistors are source terminals.

8. The voltage-controlled oscillator according to claim 2, wherein the MOS transistors are PMOS transistors, the first ends of the PMOS transistors are source terminals, and the second ends of the PMOS transistors are drain terminals.

9. The voltage-controlled oscillator according to claim 2, wherein the fifth inductor and the sixth inductor of the second voltage-controlled oscillator circuit form the primary side of a second transformer, the seventh inductor and the eighth inductor of the second voltage-controlled oscillator circuit form the secondary side of the second transformer.

* * * * *